United States Patent
Ogawa

(10) Patent No.: US 7,199,655 B2
(45) Date of Patent: Apr. 3, 2007

(54) MULTISTAGE AMPLIFIER CIRCUIT WITHOUT INTERSTAGE COUPLING CAPACITOR

(75) Inventor: Hirofumi Ogawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 159 days.

(21) Appl. No.: 11/000,065

(22) Filed: Dec. 1, 2004

(65) Prior Publication Data

US 2005/0231277 A1    Oct. 20, 2005

(30) Foreign Application Priority Data

Apr. 14, 2004    (JP) .............................. 2004-119265

(51) Int. Cl.
*H03F 3/45* (2006.01)
(52) U.S. Cl. .......................... 330/69; 330/98; 330/297
(58) Field of Classification Search ................ 330/69, 330/98, 127, 144, 297
See application file for complete search history.

(56) References Cited

U.S. PATENT DOCUMENTS 5,861,775 A * 1/1999 Chen et al. .................... 330/69

FOREIGN PATENT DOCUMENTS

| JP | 07-046055 | 2/1995 |
| JP | 09-326645 | 12/1997 |

* cited by examiner

*Primary Examiner*—Steven J. Mottola
(74) *Attorney, Agent, or Firm*—Nixon Peabody LLP; Donald R. Studebaker

(57) ABSTRACT

An input-stage amplifier (10) operating on a supply voltage (Vdd) and an output-stage amplifier (20) operating on a supply voltage (Vamp) are supplied at the non-inverting input with half the supply voltage as a reference voltage Vref. This allows the output level of the amplifier (10) and the input level of the amplifier (20) to be the same (Vref), thereby allowing connection therebetween via a resistor (21) without any capacitor. Further, resistors (22, 23) connected between the inverting input and the output of the amplifier (20) and between the inverting input and ground potential, respectively, are controlled such that the resistances satisfy R22/R23=Vamp/Vdd−1. This makes the output level of the amplifier (20) equal to Vamp/2.

5 Claims, 3 Drawing Sheets

MULTISTAGE AMPLIFIER CIRCUIT WITHOUT INTERSTAGE COUPLING CAPACITOR

BACKGROUND OF THE INVENTION

1. Field of the Invention

The present invention relates to a multiple amplifier circuit having input and output stages which employ different source voltages.

2. Description of the Related Art

In general, amplifier circuits that amplify an input signal to drive a loudspeaker or headphone include an input-stage amplifier for amplifying an input signal of low amplitude and an output-stage amplifier for delivering a signal of high amplitude to drive a loudspeaker or the like. In such an amplifier circuit, the input and output stage amplifiers need to use different source or supply voltages.

FIG. 2 is a view showing the configuration of a conventional amplifier circuit.

This amplifier circuit includes an input stage amplifier 1 that operates on a supply voltage Vdd (e.g., 2.4V) and an output stage amplifier 2 that operates on a supply voltage Vamp (e.g., 3.6V). The negative power supply terminals of these input and output stage amplifiers 1 and 2 are connected to a common ground potential GND.

In the amplifier 1, a reference voltage Vref (e.g., Vdd/2) is supplied to the non-inverting input terminal, while an input signal Vin with its DC (direct-current) level being set at the reference voltage Vref is supplied to the inverting input terminal via a resistor 3. There is provided a feedback resistor 4 connected between the output terminal of the amplifier 1 or a node N1 and the inverting input terminal.

On the other hand, in the amplifier 2, a reference voltage Vs (e.g., Vamp/2) is supplied to the non-inverting input terminal, while a signal from the node N1 is given to the inverting input terminal via a series circuit made up of a capacitor 5 and a resistor 6 for blocking DC components. There is also a feedback resistor 7 connected between the output terminal and the inverting input terminal of the amplifier 2.

In this amplifier circuit, since both the non-inverting and inverting input terminals of the amplifier 1 are set at a DC potential of Vdd/2, the node N1 is also at a DC level of Vdd/2. This allows the input signal Vin to be amplified in the amplifier 1 and delivered at a voltage (DC level) centered about Vdd/2.

On the other hand, in the amplifier 2, since the non-inverting input terminal is set at Vamp/2, the inverting input terminal is also at a DC level of Vamp/2. The node N1 and the inverting input terminal of the amplifier 2 have different DC levels; however, since the capacitor 5 is connected therebetween, no DC current flows through the resistor 6. Therefore, no DC current flows through the feedback resistor 7, so that the output terminal of the amplifier 2 is at a DC level of Vamp/2. This enables the amplifier 2 to deliver from the output terminal a distortion-free output signal Vout with its maximum amplitude of Vamp.

Reference in this regard can be had to Japanese Patent Publications Kokai No. H07-46055 and No. H09-326645.

However, the conventional amplifier circuit, which has the capacitor 5 connected between the stages to block DC components, blocks not only DC components but also low-frequency components. To amplify lower-frequency components with high fidelity as well, the capacity of the capacitor 5 and the value of the resistor 6 must be increased. However, as in the case of integrated circuits, an increase in capacity of the capacitor 5 would cause an increase in layout area, which is not practical. Worse yet, to increase the value of the resistor 6, the value of the resistor 7 also needs to be increased at the same time. This leads to not only an increase in layout area but also a decrease in current due to the increase in value of the resistor 7, thereby making the entire circuit susceptible to noise.

SUMMARY OF THE INVENTION

It is therefore an object of the present invention to provide an amplifier circuit which can use different supply voltages at the input and output stages without the need of any capacitor for blocking DC components.

An amplifier circuit according to the present invention includes: a first amplifier which has a first power supply terminal connected to a ground potential, a second power supply terminal supplied with a first supply voltage, a non-inverting input terminal supplied with a reference voltage, and an inverting input terminal supplied with an input signal via a first resistor, and which amplifies the input signal for output; a second resistor for feedback use to connect between the output side of the first amplifier and the inverting input terminal of the first amplifier; a second amplifier which has a first power supply terminal connected to the ground potential, a second power supply terminal supplied with a second supply voltage higher than the first supply voltage, a non-inverting input terminal supplied with the reference voltage, and an inverting input terminal supplied with an output signal from the first amplifier via a third resistor, and which amplifies the output signal for output; a fourth resistor for feedback use to connect between the output side of the second amplifier and the inverting input terminal of the second amplifier; and a fifth resistor connected between the inverting input terminal of the second amplifier and the ground potential.

According to the present invention, a common reference voltage is supplied to the non-inverting input terminals of the first amplifier at the input stage and the second amplifier at the output stage. This allows the output side of the first amplifier and the input side of the second amplifier to be at a DC level of the same reference voltage even when different supply voltages are applied to the first and second amplifiers. Accordingly, this serves to eliminate the necessity of a capacitor for blocking DC components. Furthermore, the fifth and fourth resistors are connected between the inverting input terminal of the second amplifier and the output terminal, and between the inverting input terminal of the second amplifier and the ground potential, respectively. This enables the DC level of an output signal from the second amplifier to be adjusted to half the supply voltage of the second amplifier by setting the fourth and fifth resistors to appropriate resistance values.

DETAILED DESCRIPTION OF THE INVENTION

With a first amplifier at the input stage being supplied with a supply voltage Vdd, a reference voltage of Vdd/2 is applied to the non-inverting input terminal of the second amplifier. The reference voltage of Vdd/2 is also applied to the non-inverting input terminal of the second amplifier at the output stage which operates on the supply voltage Vamp. Further, a fourth resistor having a resistance value R4 is connected between the inverting input terminal and the output terminal of the second amplifier, while a fifth resistor is connected between the inverting input terminal and the ground potential so that the resistance value R5 can be changed using a control signal. The resistance value R5 is set so as to meet the equation, R4/R5 32 Vamp/Vdd−1.

These and other objects and novel features of the present invention will be more readily understood upon reading the following description given to the preferred embodiments in conjunction with the accompanying drawings. However, the drawings are presented only for illustrative purposes and not intended to limit the scope of the invention.

Figure 1:
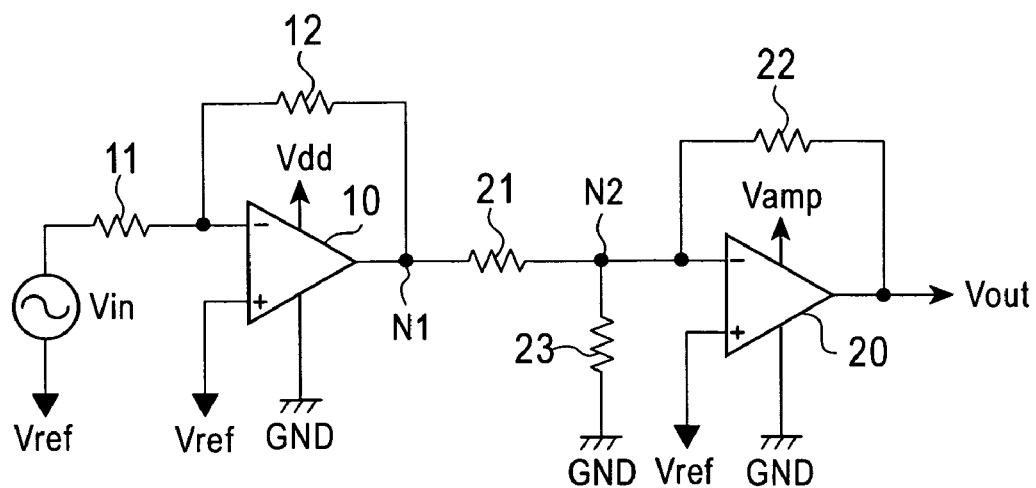
FIG. 1 is a view showing the configuration of an amplifier circuit according to a first embodiment of the present invention.
Figure 2:
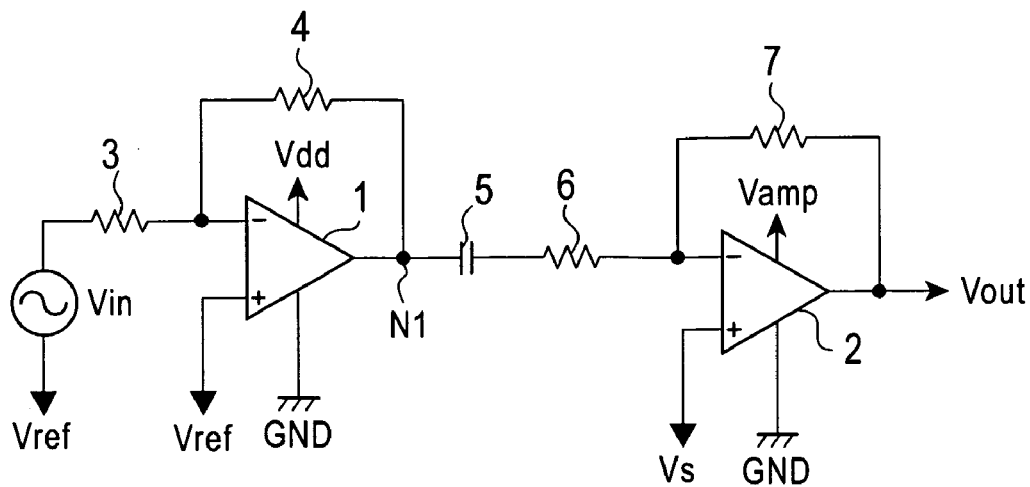
FIG. 2 is a view showing the configuration of a conventional amplifier circuit.

FIG. 1 is a view showing the configuration of an amplifier circuit according to a first embodiment of the present invention.

The amplifier circuit includes an input stage amplifier 10 that operates on a supply voltage Vdd (e.g., 2.4V) and an output stage amplifier 20 that operates on a supply voltage Vamp (e.g., 3.6V). The negative power supply terminals of these amplifiers 10 and 20 are connected to a common ground potential GND.

In the amplifier 10, a reference voltage Vref (e.g., Vdd/2=1.2V) is supplied to the non-inverting input terminal, while an input signal Vin with its DC level being set at the reference voltage Vref is supplied to the inverting input terminal via a resistor 11 (e.g., 20 kΩ). There is a feedback resistor 12 connected between the output terminal or a node N1 and the inverting input terminal of the amplifier 10.

On the other hand, in the amplifier 20, the reference voltage Vref is supplied to the non-inverting input terminal, while the inverting input terminal or a node N2 is connected to the node N1 via a resistor 21 (e.g., 20 kΩ). There is also a feedback resistor 22 connected between the output terminal and the node N2 of the amplifier 20, while a resistor 23 is connected between the node N2 and the ground potential GND.

Now, the operation of the circuit will be described below.

In this amplifier circuit, both the non-inverting and inverting input terminals of the amplifier 10 are set at a DC potential of the reference voltage Vref (=Vdd/2) so that the node N1 is also at a DC level of Vref. This allows the input signal Vin to be amplified in the amplifier 10 and delivered at a voltage (DC level) centered about Vref.

On the other hand, in the amplifier 20, the non-inverting input terminal is set at the reference voltage Vref so that the inverting input terminal (i.e., node N2) is also at a potential of the reference voltage Vref. This causes no potential difference between the node N1 and the node N2, thus allowing no DC current to flow through the resistor 21.

Here, assume that the resistors 22 and 23 of the amplifier 20 side have values R22 and R23, respectively, and current "i" flows through the resistor 23. Then, the following equation (1) is satisfied;

$$R23 \times i = \text{Vref} \quad (1)$$

Since no DC current flows through the resistor 21 as well as no current flows into or out of the inverting input terminal of the amplifier 20, the same current "i" as flows through the resistor 21 also flows through the resistor 22. Accordingly, assuming Vout to be the DC level of the output signal from the amplifier 20, the following equation (2) is satisfied;

$$\text{Vout} = R22 \times i + \text{Vref} \quad (2)$$

From the equations (1) and (2), the following equation (3) can be obtained;

$$\text{Vout} = (1 \times R22/R23) \times \text{Vref} \quad (3)$$

Therefore, for example, letting the values of the resistors 22 and 23 be 40 kΩ and 80 kΩ, respectively, the DC level Vout of the output signal from the amplifier 20 is equal to 1.8V which is half the supply voltage Vamp (=3.6V) of the amplifier 20.

To achieve the optimal state in which a distortion-free output signal of the maximum amplitude is obtained in this amplifier circuit, the reference voltage Vref and the DC level Vout should be half the supply voltages Vdd and Vamp, respectively. Therefore, the condition for the optimal state can be expressed by the following equation (4);

$$R22/R23 = \text{Vamp}/\text{Vdd} - 1 \quad (4)$$

Accordingly, the input signal Vin is amplified in the amplifiers 10 and 20, allowing a distortion-free output signal with the maximum amplitude of Vamp to be delivered from the output terminal of the amplifier 20.

As described above, in the first embodiment, the input stage amplifier 10 and the output stage amplifier 20, which operate on their respective different supply voltages Vdd and Vamp, are set at the same DC input level of the reference voltage Vref, thereby eliminating the necessity of a capacitor for blocking DC components. This enables the chip to be reduced in area or a terminal connecting to an external capacitor to be eliminated.

Furthermore, the resistors 22 and 23 connect between the inverting input terminal of the output stage amplifier 20 and the output terminal and between the inverting input terminal and the ground potential GND, respectively. This enables the DC level of the output signal from the amplifier 20 to be adjusted to an optimal value (i.e., half the supply voltage Vamp) by setting the values of the resistors 22 and 23 based on the equation (4).

Figure 3:
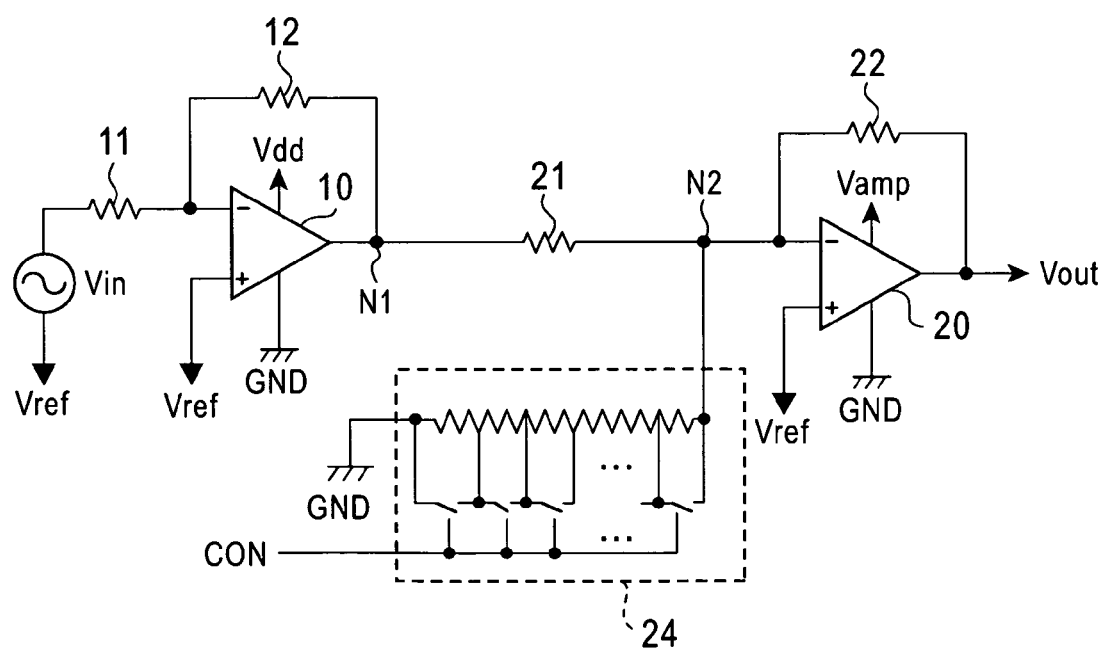
FIG. 3 is a view showing the configuration of an amplifier circuit according to a second embodiment of the present invention.

FIG. 3 is a view showing the configuration of an amplifier circuit according to a second embodiment of the present invention, in which the components similar to those in FIG. 1 are indicated with like symbols.

This amplifier circuit is provided with a variable resistor 24 in place of the resistor 23 in the amplifier circuit of FIG. 1. The variable resistor 24 includes a plurality of resistors connected in series and switches for individually short-circuiting these resistors in accordance with a control signal CON. The other configuration is the same as in FIG. 1.

In this amplifier circuit, the value of the variable resistor 24 is set in response to the control signal CON in accordance with the supply voltages Vdd and Vamp that are provided to the two amplifiers 10 and 20.

For example, assume that the supply voltage Vamp=3.6V, the resistance value R22=40 kΩ, and the reference voltage Vref=Vdd/2. The resistance value R24 of the variable resistor 24 may be set as follows in accordance with the value of the supply voltage Vdd at the input stage. This allows for setting the DC level Vout of the output signal from the amplifier 20 to an optimal value (Vamp/2).

That is, R24=160 kΩ at Vdd=2.88V, R24=110 kΩ at Vdd=2.64V, R24=80 kΩ at Vdd=2.4V, and R24=60 kΩ at Vdd=2.16V.

As described above, the second embodiment has the variable resistor 24 which provides control to the resistance value according to the control signal CON, thereby advantageously providing flexibility to supporting various types of supply voltages in addition to the same advantages as those of the first embodiment.

Figure 4:
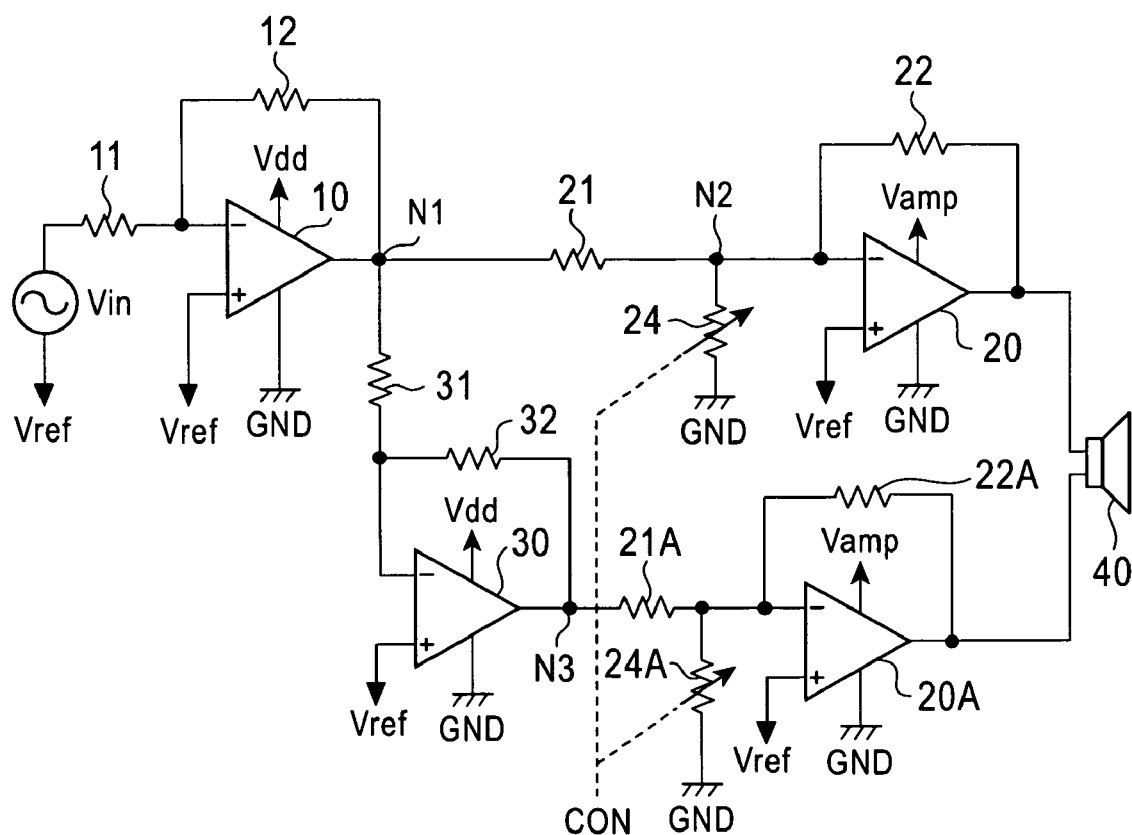
FIG. 4 is a view showing the configuration of an amplifier circuit according to a third embodiment of the present invention.

FIG. 4 is a view showing the configuration of an amplifier circuit according to a third embodiment of the present invention. This amplifier circuit is constructed in the BTL (Bridge Tied Load) configuration as an application of the amplifier circuit of FIG. 3, in which the components similar to those in FIG. 3 are indicated with like symbols.

The output of the input stage amplifier 10 is connected to an amplifier 30 for inverting an output signal from the amplifier 10. That is, the node N1 is connected to the inverting input terminal of the amplifier 30 via a resistor 31 (e.g., 20 kΩ), while a feedback resistor 32 (e.g., 20 kΩ) is connected between the inverting input terminal and a node N3 serving as the output terminal of the amplifier 30. Like the amplifier 10, the amplifier 30 operates on the supply voltage Vdd, while the reference voltage Vref is supplied to the non-inverting input terminal.

Like the amplification portion employing the amplifier 20, the node N3 is connected with a complementary amplification portion employing an amplifier 20A. Specifically, the reference voltage Vref is supplied to the non-inverting input terminal of the amplifier 20A, while the inverting input terminal is connected to the node N3 via a resistor 21A (e.g., 20 kΩ). A feedback resistor 22A connects between the output terminal and the inverting input terminal of the amplifier 20A, while a variable resistor 24A connects between the inverting input terminal and the ground potential GND.

The amplifier 20A, which has the same characteristics as those of the amplifier 20, also operates on the same supply voltage Vamp. The variable resistors 24 and 24A are set simultaneously to the same resistance value in response to the control signal CON. A load 40 such as a loudspeaker is connected between the output terminals of the amplifiers 20 and 20A.

In this amplifier circuit, the output signal from the amplifier 10 is supplied to the amplifier 20 and amplified with its polarity remaining unchanged, while the output signal from the amplifier 10 is supplied to the amplifier 20A and amplified with its polarity inverted by the amplifier 30. Then, the output signals having opposite polarities from the two amplifiers 20 and 20A drive the load 40. It is thus made possible to drive the load 40 with an output signal having twice the amplitude of that from the amplifier circuit of FIGS. 1 and 3.

As described above, the third embodiment allows the BTL configuration to provide the same advantages as those of the second embodiment. Furthermore, the positive and negative inputs of the amplifiers 20 and 20A require no capacitors for blocking DC components, thereby advantageously providing distortion-free output signals that would otherwise result from a difference in capacity between those capacitors.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2004-119265 which is hereby incorporated by reference.

What is claimed is:

1. A multistage amplifier circuit comprising:
   a first amplifier having a first power supply terminal connected to a ground potential, a second power supply terminal supplied with a first supply voltage, a non-inverting input terminal supplied with a reference voltage, and an inverting input terminal supplied with an input signal via a first resistor, the first amplifier amplifying the input signal for output;
   a second resistor for feedback use to connect between the output side of the first amplifier and the inverting input terminal of the first amplifier;
   a second amplifier having a first power supply terminal connected to the ground potential, a second power supply terminal supplied with a second supply voltage higher than the first supply voltage, a non-inverting input terminal supplied with the reference voltage, and an inverting input terminal supplied with an output signal from the first amplifier via a third resistor, the second amplifier amplifying the output signal for output;
   a fourth resistor for feedback use to connect between the output side of the second amplifier and the inverting input terminal of the second amplifier; and
   a fourth resistor connected between the inverting input terminal of the second amplifier and the ground potential.

2. The amplifier circuit according to claim 1, wherein the reference voltage and the resistance values of the fourth arid fifth resistors are set such that the following two equations hold;

Vref=Vdd/2 and R4/R5=Vamp/Vdd−1, where Vdd and Vamp are the first and second power supply voltages, respectively, Vref is the reference voltage, and R4 and R5 are resistance values of the fourth and fifth resistors, respectively.

3. The amplifier circuit according to claim 1, wherein the fifth resistor comprises a variable resistor, a resistance value of which can be changed in accordance with a control signal.

4. A multistage amplifier circuit comprising:
   a first amplifier having a first power supply terminal connected to a ground potential, a second power supply terminal supplied with a first supply voltage, a non-inverting input terminal supplied with a reference voltage, and an inverting input terminal supplied with an input signal via a first resistor, the first amplifier amplifying the input signal for output;
   a second resistor for feedback use to connect between the output side of the first amplifier and the inverting input terminal of the first amplifier;
   a second amplifier having a first power supply terminal connected to the ground potential, and a second power supply terminal supplied with the first supply voltage, the second amplifier inverting the polarity of an output signal from the first amplifier for output;
   a third amplifier having a first power supply terminal connected to the ground potential, a second power supply terminal supplied with a second supply voltage higher than the first supply voltage, a non-inverting input terminal supplied with the reference voltage, and an inverting input terminal supplied with the output signal from the first amplifier via a third resistor, the third amplifier amplifying the output signal to drive one end of a load;

a fourth resistor for feedback use to connect between the output side of the second amplifier and the inverting input terminal of the second amplifier;

a fifth resistor connected between to inverting input terminal of the second amplifier and the ground potential;

a fourth amplifier having a first power supply terminal connected to the ground potential, a second power supply terminal supplied with the second supply voltage, a non-inverting input terminal supplied with the reference voltage, and an inverting input terminal supplied with an output signal from the second amplifier via a sixth resistor, the fourth amplifier amplifying the output signal to drive the other end of the load;

a seventh resistor for feedback use to connect between the output side of the fourth amplifier and the inverting input terminal of the fourth amplifier; and an eighth resistor connected between the inverting input terminal of the fourth amplifier and the ground potential.

5. The amplifier circuit according to claim 4, wherein the fifth and eighth resistors comprise a variable resistor, a resistance value of which can be changed simultaneously in accordance with the same control signal.

* * * * *